(12) United States Patent
Goel et al.

(10) Patent No.: US 11,635,465 B2
(45) Date of Patent: Apr. 25, 2023

(54) DEVICE AND METHOD FOR MONITORING DATA AND TIMING SIGNALS IN INTEGRATED CIRCUITS

(71) Applicant: STMicroelectronics International N.V., Geneva (CH)

(72) Inventors: Rohit Goel, Patiala (IN); Anand Kumar Mishra, Ghaziabad (IN); Rajnish Garg, Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/504,139

(22) Filed: Oct. 18, 2021

(65) Prior Publication Data
US 2022/0137133 A1     May 5, 2022

Related U.S. Application Data

(60) Provisional application No. 63/107,090, filed on Oct. 29, 2020.

(51) Int. Cl.
*G01R 31/3185*     (2006.01)

(52) U.S. Cl.
CPC ........ *G01R 31/318525* (2013.01); *G01R 31/318552* (2013.01); *G01R 31/318566* (2013.01); *G01R 31/318594* (2013.01)

(58) Field of Classification Search
CPC .... G01R 31/318525; G01R 31/318552; G01R 31/318566; G01R 31/318594; G01R 31/3016; G01R 31/31725; G01R 31/2851; H03K 19/00315
See application file for complete search history.

(56) References Cited

U.S. PATENT DOCUMENTS

| | | | |
|---|---|---|---|
| 6,148,425 A | 11/2000 | Bhawmik et al. | |
| 6,185,711 B1 * | 2/2001 | Leung | G01R 31/31725 714/724 |
| 6,999,547 B2 | 2/2006 | Braceras et al. | |
| 7,409,631 B2 * | 8/2008 | Tschanz | G01R 31/31726 714/724 |
| 7,650,551 B2 | 1/2010 | Flautner et al. | |
| 7,653,850 B2 | 1/2010 | Tschanz et al. | |

(Continued)

OTHER PUBLICATIONS

S. Valadimas, Y. Tsiatouhas and A. Arapoyanni, "Timing error tolerance in nanometer ICs," 2010 IEEE 16th International On-Line Testing Symposium, Corfu, Greece, 2010, pp. 283-288. (Year: 2010).*

*Primary Examiner* — Cynthia Britt
(74) *Attorney, Agent, or Firm* — Seed IP Law Group

(57) ABSTRACT

An integrated circuit includes a data propagation path including a flip-flop. The flip-flop includes a first latch and a second latch. The integrated circuit includes a third latch that acts as a dummy latch. The input of the third latch is coupled to the output of the first latch. The integrated circuit includes a fault detector coupled to the output of the flip-flop and the output of the third latch. The third latch includes a signal propagation delay selected so that the third latch will fail to capture data in a given clock cycle before the second latch of the flip-flop fails to capture the data in the given clock cycle. The fault detector that detects when the third latch is failed to capture the data.

20 Claims, 6 Drawing Sheets

(56) References Cited

U.S. PATENT DOCUMENTS

| | | | |
|---|---|---|---|
| 2002/0118046 A1* | 8/2002 | Senba | G01R 31/31727 327/47 |
| 2010/0079184 A1* | 4/2010 | Bowman | H03K 3/0375 327/225 |
| 2010/0244918 A1* | 9/2010 | Moyer | H03K 3/356156 327/261 |
| 2010/0251046 A1* | 9/2010 | Mizuno | G01R 31/31725 714/724 |
| 2012/0068749 A1* | 3/2012 | Sood | H03K 3/35625 327/202 |
| 2017/0139006 A1 | 5/2017 | Bowman et al. | |
| 2020/0389156 A1* | 12/2020 | Gupta | G06F 1/3206 |

\* cited by examiner

DEVICE AND METHOD FOR MONITORING DATA AND TIMING SIGNALS IN INTEGRATED CIRCUITS

BACKGROUND

Technical Field

The present disclosure relates to the field of integrated circuits. The present disclosure relates more particularly to monitoring timing signals in integrated circuit logic circuits.

Description of the Related Art

Integrated circuits often include a large number of flip-flops and other logic circuits. Signals are passed through the various flip-flops and other logic circuits. In many cases, the signals are expected to pass through certain sections of circuitry in very tight timing windows. If signals are not passed within these time windows, it is possible that there will be failures in the functionality of the integrated circuit.

FIG. 1A is a block diagram of a portion of an integrated circuit 100. The integrated circuit includes a first flip-flop 101, a second flip-flop 102, and combination logic 103. The first flip-flop 101 has a data input D1, a data output Q1, and a clock input CLK. The second flip-flop 102 has a data input D2, a data output Q2, and a clock input CLK. The first and second flip-flops each receive the same clock signal.

The combination logic 103 is positioned between the data output Q1 of the first flip-flop 101 and the data input D2 of the second flip-flop 102. The combination logic 103 can include one or more logic gates, buffers, inverters, or other types of circuit components. The combination logic 103 may be configured to receive a signal from the first flip-flop 101 and pass the signal, or another signal based on the original signal, to the flip-flop 102.

FIG. 1B is a timing diagram 150 of signals associated with the integrated circuit 100 of FIG. 1A. In particular, the timing diagram 150 illustrates the clock signal at the clock terminals CLK of both the first and second flip-flops 101, 102, the voltage at the data input D1 of the first flip-flop 101, the voltage at the data output Q1 of the first flip-flop 101, and the voltage at the data input D2 of the second flip-flop 102. The functionality of the flip-flops 101, 102, and the combination logic 103 will be described in relation to FIGS. 1A and 1B.

At time T0, the data input D1 of the first flip-flop 101 goes high. This corresponds to the first flip-flop 101 receiving data. At time T1, the CLK goes high. If the data has arrived at the data input D1 before the clock signal CLK goes high, then the first flip-flop 101 will process the data during that clock cycle. This means that the flip-flop 101 will pass the data signal at D1 to the data output Q1 responsive to the rising edge of the clock signal. Accordingly, data that arrives at the data input D1 will be processed by the flip-flop 101 upon the next rising edge of the clock signal.

At time T2, the data output Q1 goes high. This corresponds to the flip-flop 101 having processed the data received at D1. As can be seen in FIG. 1B, there is a delay between the rising edge of the clock signal, and the data appearing at the data output Q1. This delay is referred to as "Delay 1" in FIG. 1B. The delay is a result of signals being passed through the internal circuitry of the flip-flop 101.

The combination logic 103 receives the data from the data output Q1 of the first flip-flop 101. The combination logic 103 processes the data signal and passes the data signal to the data input D2 of the second flip-flop 102. At time T3, the data input D2 of the second flip-flop 102 goes high. This corresponds to the flip-flop 102 receiving the data signal from the combination logic 103. As can be seen in FIG. 1B, there is a second delay, "Delay 2", between the data output Q1 of the first flip-flop 101 going high and the data input D1 of the second flip-flop 102 going high. This delay corresponds to the processing time of the combination logic 103.

At time T4, the clock signal goes high. If the data input D2 of the second flip-flop 102 has received the data signal from the combination logic prior to the rising edge of the clock signal, then the second flip-flop 102 will process the data and pass the data to the data output Q2 of the second flip-flop 102 responsive to the rising edge of the clock signal. However, as indicated in FIG. 1B, there is a third delay, "Delay 3", between D2 going high and the rising edge of the clock signal. The third delay corresponds to the setup delay of the second flip-flop 102. After the data is output by the combination logic 103 and received at the data input D2, there is a setup time for the second flip-flop 102 to be able to process the data. If the clock signal goes high before the completion of the setup time then the flip-flop 102 will not process the data until the next rising edge of the clock signal.

In some situations, proper operation of the integrated circuit 100 may depend on the second flip-flop 102 receiving the data signal and being set up within the same clock cycle that caused the first flip-flop 101 to process the data signal. In other words, proper operation of the integrated circuit may depend on the first flip-flop processing data, the combination logic receiving and processing data, and the second flip-flop receiving the data and being ready to process the data all within a single clock cycle.

Circuit designers typically design the flip-flops 101, 102, and the combination logic 103 such that the sum of the three delays (Delay 1+ Delay 2+ Delay 3) is less than the period of a single clock cycle. Circuit designers typically design the circuit such that the sum of the three delays is less than the period of the clock signal by some buffer value. The buffer value is included so that variations in any or all the delays will likely still not some data value greater than the period of the clock cycle. Nevertheless, it is possible that various factors can result in the sum of the delays being greater than the period of the clock cycle.

BRIEF SUMMARY

An integrated circuit includes a detection circuit for detecting when a flip-flop is approaching a timing failure. In particular, the detection circuit detects when the processing of signals in the flip-flop encroaches on a timing buffer. Failure of the flip-flop to operate within timing specifications will occur only if the signal processing time entirely surpasses the timing buffer. The detection circuit detects encroachment into the timing buffer and raises a flag if encroachment into the timing buffer occurs. Accordingly, the detection circuit raises the flag before failure occurs. This enables the integrated circuit to take steps to ensure that a timing failure will not occur.

The detection circuit takes up a small amount of integrated circuit area. In particular, the detection circuit utilizes a single detection latch and a logic gate to monitor timing of the flip-flop. The flip-flop includes a first latch and a second latch. The detection latch receives a signal from a midpoint between the first and second latches of the flip-flop, but through a delay element corresponding to either an external delay or a clock-managed delay. If the detection latch does not process the signal received from the midpoint within the timing window, then logic gate raises a flag. Because the detection latch receives the signal through a delay element, the detection latch will fail to process the signal within the timing window before the flip-flop would actually fail. Accordingly, the delay element acts as a buffer to detect that the flip-flop is approaching a timing failure before the flip-flop actually fails.

DETAILED DESCRIPTION

Figure 1A:
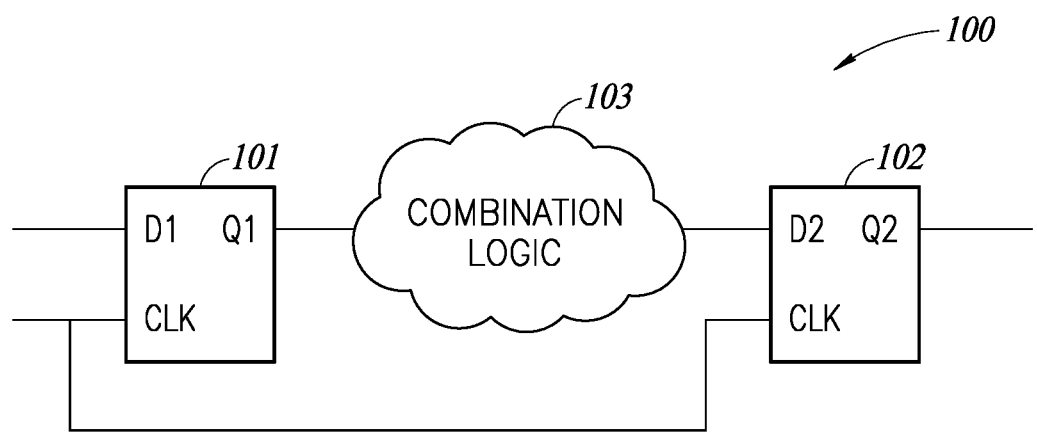
FIG. 1A is a block diagram of a traditional integrated circuit including register to register timing paths in digital design.
Figure 1B:
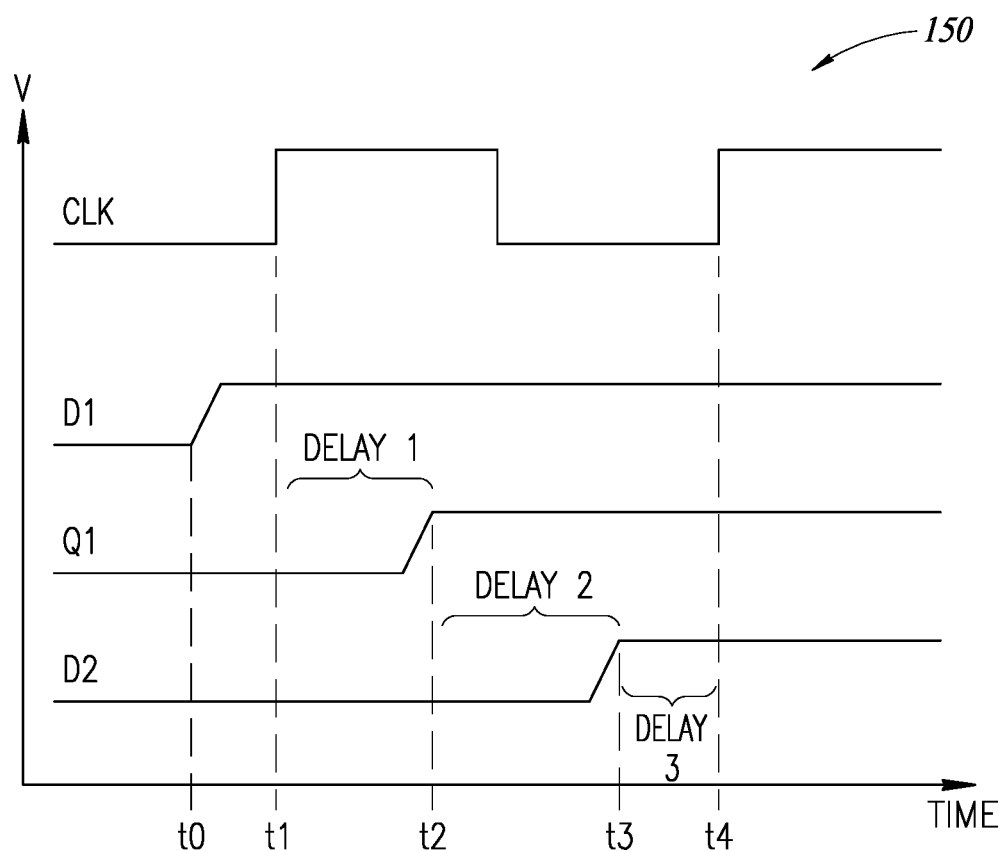
FIG. 1B is a timing diagram of signals within the integrated circuit of FIG. 1A.
Figure 2:
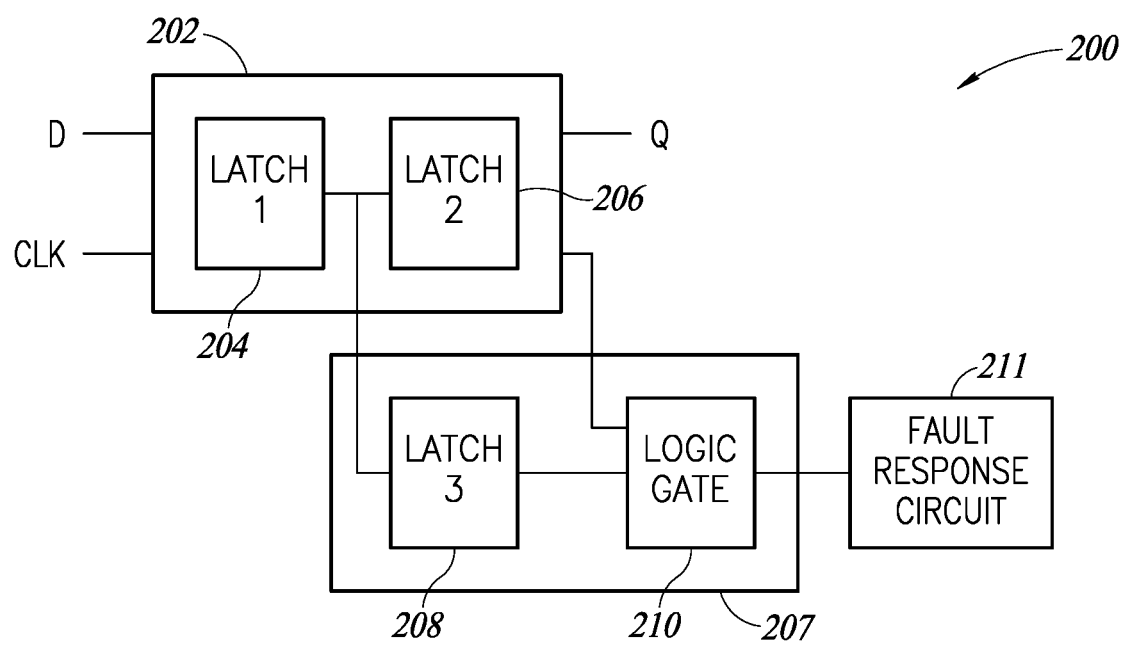
FIG. 2 is a block diagram of an integrated circuit, according to one embodiment.

FIG. 2 is a block diagram of an integrated circuit 200, according to one embodiment. The integrated circuit 200 includes a flip-flop 202 having a first latch 204 and a second latch 206. The integrated circuit 200 further includes a fault detection circuit 207 including a third latch 208, a logic gate 210, and a fault response circuit 211. As will be set forth in more detail below, the components of the integrated circuit 200 cooperate to detect delays that approach or exceed specified timing windows. The integrated circuit 200 can address greater than expected timing signal delays.

The flip-flop 202 includes a data input D, a clock input CLK, and a data output Q. The flip-flop 202 will pass data received at the data input D to the data output Q. In particular, the flip-flop 202 will pass data from the data input D to the data output Q responsive to a clock signal received at the clock input CLK. In particular, data that is received at the data input D will be passed to the data output Q responsive to the next rising edge of the clock signal.

The flip-flop 202 may have a set up delay. In other words, after data appears at the data input D, the flip-flop 202 may take some amount of time to set up before the data can be processed. If, after data has been received at the data input D, the rising edge of the clock signal is received before the setup time is complete, then the flip-flop 202 may not process the data responsive to the rising edge of the clock signal. Instead the flip-flop 202 may not process the data until an entire clock cycle has passed and a second rising edge is received at the clock input CLK.

In some embodiments, the flip-flop 202 may be part of a chain of flip-flops or a chain of one or more flip-flops and another logic circuit. Proper functionality of the integrated circuit 200 may depend on the second flip-flop 202 receiving and processing data within a particular timing window. For example, the flip-flop 202 may receive data from another flip-flop (not pictured). Proper functionality of the integrated circuit 200 may depend on the flip-flop 202 receiving data and setting up to process the data within a single clock cycle from when the previous flip-flop began processing the data.

There may be multiple delays in the flip-flops and any intervening circuitry. The sum of these delays may be expected to be less than a single clock cycle so that proper functionality of the integrated circuit is insured. The sum of the delays may be expected to be less than a single clock cycle by a buffer time. However, many factors can result in the delays encroaching into the buffer time or even exceeding the expected timing window. For example, process variations during fabrication of integrated circuits can lead to built-in delays of the integrated circuit 200 being longer than expected. Furthermore, as the integrated circuit 200 ages, circuit delays may increase. Accordingly, it is possible that the delays may encroach on or exceed the expected timing windows. If this happens, then the integrated circuit 200 may not function properly.

The integrated circuit 200 utilizes the detection circuit 207 to detect whether the delays intrude into the buffer window or even surpass the timing window. The logic gate 210 receives a signal from the flip-flop 202 and from the third latch 208. Depending on the values of the signals received from the flip-flop 202 and the third latch 208, the logic gate 210 can detect whether circuit delays associated with the flip-flop 202 have surpassed a buffer window or even the entire timing window.

One possible solution for providing signals to the logic gate 210 is to pass an output signal from the flip-flop 202 to a dummy flip-flop. The dummy flip-flop is nearly identical to the flip-flop 202, except that the dummy flip-flop introduces a greater delay than the flip-flop 202. The data signal is passed to the flip-flop 202 and to the dummy flip-flop. The flip-flop 202 and the dummy flip-flop process the data and pass the data to the logic gate 210. In the case of a near timing failure in the flip-flop 202, there will be an actual timing failure in the dummy flip-flop because of its larger set up time. The timing failure will result in the dummy flip-flop not capturing and processing the data in the intended clock cycle. The logic gate 210 can detect that the dummy flip-flop did not capture and process the data. The logic gate 210 can then output a flag indicating that the flip-flop 202 is approaching a set up failure. If this solution is utilized a large number of times for various signal paths throughout the integrated circuit, then a relatively large amount of integrated circuit area may be consumed.

Accordingly, the integrated circuit 200 utilizes a detection circuit 207 that utilizes the third latch 208 as a dummy latch, rather than utilizing an entire dummy flip-flop. The flip-flop 202 includes a first latch 204 and a second latch 206. The third latch 208 acts as a shadow or dummy path. The third latch 208 includes a signal delay relative to the first latch 204.

The input of the third latch 208 is coupled to the output of the first latch 204 and the input of the second latch 206. In other words, the input of the third latch 208 is coupled to the junction between the first and second latches 204, 206. Coupling the third latch to the input of the second latch 206 enables the dummy path to include the single latch 208 rather than an entire dummy flip-flop.

The third latch 208 is nearly identical to the first latch 204, except that the third latch 208 introduces a greater delay than the first latch 204. The output of the first latch 204 is passed to the second latch 206 and the third latch 208. The second latch 206 and the third latch 208 process the data and pass the data to the logic gate 210. In the case of a near timing failure in the flip-flop 202, there will be an actual failure in the third latch 208 because of its larger set up time. The set up violation will result in the third latch 208 not capturing and processing the data in the intended clock cycle. The logic gate 210 can detect that the third latch 208 did not capture and process the data. The logic gate 210 can then output a flag indicating that the flip-flop 202 is approaching a timing failure. If this solution is utilized a large number of times for various signal paths throughout the integrated circuit, then a relatively large amount of integrated circuit area is saved relative to a solution in which an entire dummy flip-flop is used in each instance.

In one embodiment, the logic gate 210 acts as a comparator. The logic gate 210 detects whether or not the output of the flip-flop 202 matches the output of the third latch 208. If the output of the third latch 208 does not match the output of the flip-flop 202, then the logic gate 210 can raise a flag indicating that the flip-flop 202 is near a timing failure.

In one embodiment, the logic gate 210 receives the data output Q from the flip-flop 202. The output of the third latch 208 is the equivalent of the output of the first latch 204, except with a delay. The output of the second latch 206 is the output of the flip-flop 202. Alternatively, the logic gate 210 can receive another signal from the flip-flop 202. The logic gate 210 is configured to identify the risk of timing failure in the flip-flop 202 based on the signals received from the flip-flop 202 and the third latch 208.

The integrated circuit 200 includes a fault response circuit 211. The fault response circuit 211 is coupled to the logic gate 210. When the logic gate 210 raises a flag indicating a near timing failure, the fault response circuit 211 can take one or more actions to address the near timing failure. In one embodiment, the fault response circuit 211 deactivates a portion of the integrated circuit 200 responsive to the near timing failure. The fault response circuit 211 can output a message or notification indicating a timing failure, or near timing failure has occurred.

The fault response circuit 211 can adjust the clock signal frequency responsive to the flag raised by the logic gate 210. For example, the fault response circuit 211 can automatically reduce the clock signal frequency in order to ensure that data is captured by a flip-flop 202 within the appropriate clock cycle. Reducing the clock frequency has the effect of increasing the period of the clock signal. This results in an increase in the timing window.

Figure 3:
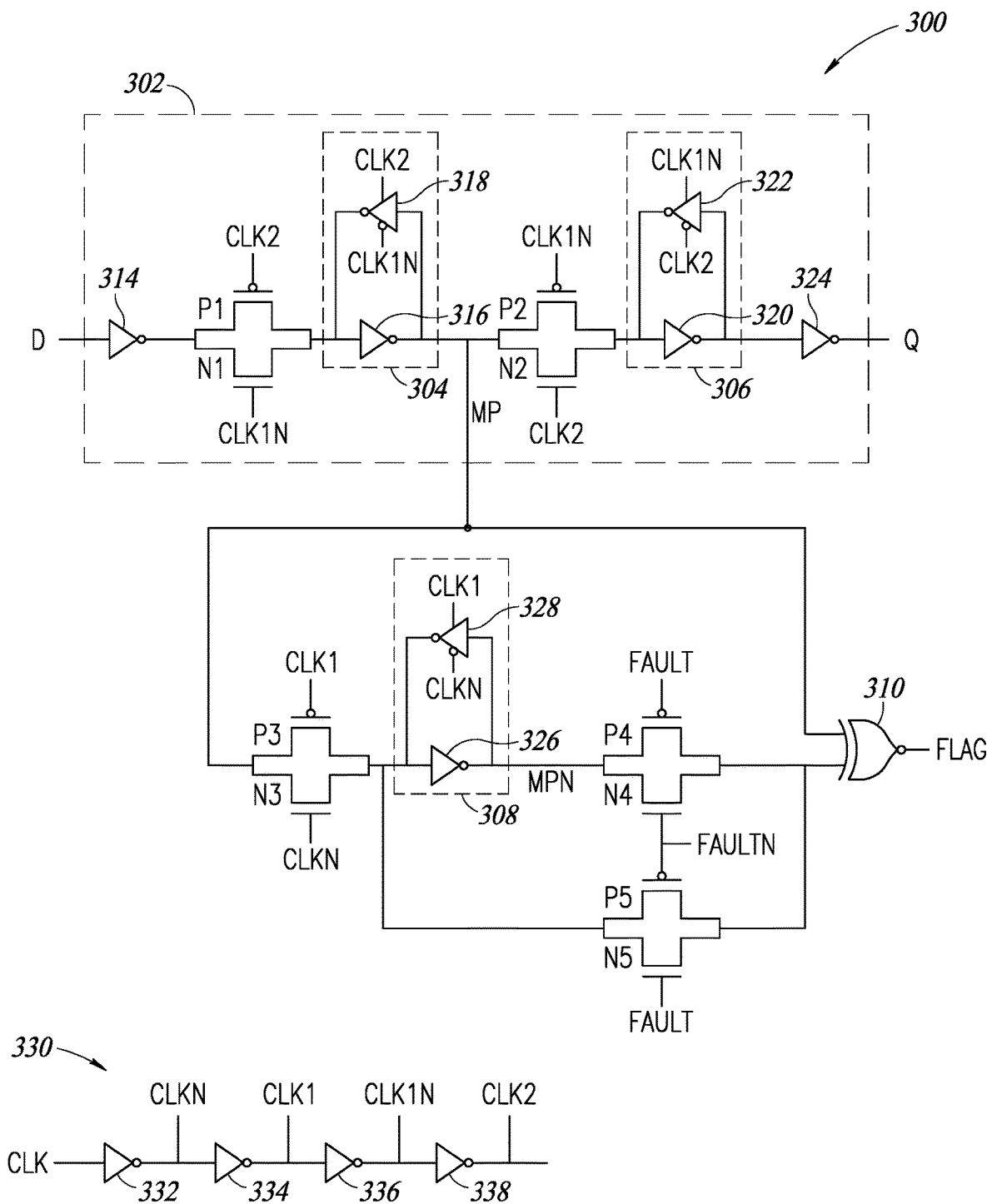
FIG. 3 is a schematic diagram of an integrated circuit, according to one embodiment.

FIG. 3 is a schematic diagram of an integrated circuit 300, according to one embodiment. The integrated circuit 300 includes a flip-flop 302. The flip-flop 302 includes a first latch 304 and a second latch 306. The integrated circuit 300 includes a third latch 308 and a logic gate 310. The components of the integrated circuit 300 cooperate to detect potential timing failures in the flip-flop 302.

The integrated circuit 300 includes a clock generation circuit 330. The clock generation circuit 330 includes four inverters 332, 334, 336, and 338, coupled together in series. The clock generation circuit 300 receives at an input of the inverter 332 a clock signal CLK. The inverter 332 outputs a clock signal CLKN that is the complement of CLK, but slightly delayed due to the inherent delay of the inverter 332. The inverter 334 receives CLKN and generates the clock signal CLK1. CLK1 is the complement of CLKN but slightly delayed due to the inherent delay of the inverter 334. The inverter 336 receives CLK1 and generates the clock signal CLK1N. CLK1N is the complement of CLK1, but slightly delayed due to the inherent delay of the inverter 336. The inverter 338 receives CLK1N and generates the clock signal CLK2. CLK2 is the logical complement of CLK1N, but slightly delayed due to the inherent delay of the inverter 338. The integrated circuit 300 utilizes the variously delayed clock signals to detect timing failures or near timing failures, as will be explained in more detail below.

The flip-flop 302 includes an inverter 314 and an inverter 324. The input of the inverter 314 is the data input D of the flip-flop 302. The output of the inverter 324 is the data output Q of the flip-flop 302. The flip-flop 302 includes a first PMOS transistor P1 and a first NMOS transistor N1 coupled between the output of the inverter 314 and the input of the first latch 304. The transistors P1 and N1 form a pass gate. The gate terminal of the first PMOS transistor P1 receives the clock signal CLK2. The gate terminal of the first NMOS transistor N1 receives the clock signal CLKN1. The flip-flop 302 includes a second PMOS transistor P2 and a second NMOS transistor N2 coupled between the output of the first latch 304 and the input of the second latch 306. The transistors P2 and N2 form a pass gate. The gate terminal of the second PMOS transistor P2 receives the clock signal CLKN1. The gate terminal of the second NMOS transistor N2 receives the clock signal CLK2.

The first latch 304 includes an inverter 316 and an inverter 318 cross coupled together. The input of the first latch 304 is the input of the inverter 316 and the output of the inverter 318. The output of the first latch 304 is the output of the inverter 316 and the input of the inverter 318. The inverter 318 receives, on supply terminals, the clock signals CLK2 and CLK1N. The output of the first latch 304 is the midpoint terminal MP of the flip-flop 302.

The second latch 306 includes an inverter 320 and an inverter 322 cross coupled together. The input of the second latch 306 is the input of the inverter 320 and the output of the inverter 322. The output of the second latch is the output of the inverter 320 and the input of the inverter 322. The inverter 322 receives, on supply terminals, the clock signals CLK1N and CLK2.

The input of the third latch 308 is coupled to the output of the first latch 304 via a third PMOS transistor P3 and a third NMOS transistor N3. The transistors P3 and N3 form a pass gate. The gate terminal of the PMOS transistor P3 receives the clock signal CLK1. The gate terminal of the NMOS transistor N3 receives the clock signal CLKN. The third latch 308 includes an inverter 326 and an inverter 328 cross coupled together. The input of the latch 308 is the input of the inverter 326 and the output of the inverter 328. The output of the latch 308 is the output of the inverter 326 and the input of the inverter 328. The output of the latch 308 is labeled MPN. The inverter 328 receives, on supply terminals, the clock signals CLK1 and CLKN.

The integrated circuit 300 includes PMOS transistor P4 and NMOS transistor N4 coupled between the output of the third latch 308 and an input of the logic gate 310. The transistors P4 and N4 form a pass gate. The gate of the PMOS transistor P4 receives the control signal FAULT. The gate of the NMOS transistor N4 receives the control signal FAULTN, which is the logical complement of FAULT.

The integrated circuit 300 includes PMOS transistor P5 and NMOS transistor N5 coupled between the input of the third latch 308 and an input of the logic gate 310. The PMOS transistor P5 and the NMOS transistor N5 form a pass gate. The gate of the PMOS transistor P5 receives the control signal FAULTN. The gate of the NMOS transistor N5 receives the control signal FAULT.

In one embodiment, a first input of the logic gate 310 is coupled to the output MP of the first latch 304. A second input of the logic gate 310 is coupled, as described before, to the output MPN of the third latch 308 via the pass gate formed by the transistors P4 and N4.

The flip-flop 302 is controlled by clock signals CLK2 and CLK1N. The third latch 308 is controlled, via the inverter 328 and the pass gate formed by N3 and P3, by the clock signals CLK1 and CLKN. As can be seen in the clock generation circuit 330 of FIG. 3, CLK1 and CLKN are upstream from CLK2 and CLK1N in the chain of inverters 332, 334, 336, and 338. Accordingly, the third latch 308 receives clock signals that are slightly ahead of the clock signals received by the flip-flop 302. Because the clock signals that control the latch 308 are slightly ahead of the clock signals that control flip-flop 302, the latch 308 will fail to capture data received from the output of the inverter 304 before the rising edge of its clock signal before the latch 306 will fail to capture data received from the output of the inverter 304.

Accordingly, the latch 308, via the earlier clock signals CLKN and CLK1, can act as part of an early warning system with the logic gate 310. If the delays associated with the flip-flop 302 encroach on the previously described buffer time that ensures the timing signals fall within the timing window, then the third latch 308 will fail to capture data before the second latch 306 fails to capture data because the rising edge of CLKN and CLK1 happens before the rising and falling edges of CLK1N and CLK2. The logic gate 310 will detect that the latch 308 has failed to capture the data signal. The result is that the logic gate 310 outputs a flag indicating that the flip-flop 302 is approaching timing signal failure.

In alternative embodiments, the first input of the logic gate 310 may receive the output Q of the flip-flop 302 or the output of the $2^{nd}$ latch 306. In these embodiments, the logic gate 310 can detect when the second latch 306 has captured data within the timing window and the third latch has not. The logic gate 310 can receive and compare signals from various points in the flip-flop 302 and the third latch 308 in accordance with principles of the present disclosure without departing from the scope of the present disclosure.

In one embodiment, the logic gate 310 is an exclusive NOR (XNOR) logic gate. However, the logic gate 310 can include other types of comparison or logic circuits that are able to detect that the third latch 308 has failed to capture the data signal within the buffered timing window. Other types of comparison or logic circuits can be utilized without departing from the scope of the present disclosure.

The control signals FAULT and its logical complement FAULTN are utilized to test the third latch and fault detector. In the testing state, FAULT is at the high logic value and FAULTN is at the low logic value. The result is that the pass gate formed by transistors P4 and N4 will not pass signals from the latch 308 because P4 and N4 are nonconducting. The pass gate formed by transistors P5 and N5 will pass signals because both P5 and N5 are conducting. In this case, the latch 308 is bypassed and the logic gate 310 is forced to cause FLAG to go high.

In the standard operating mode, FAULT is low and FAULTN is high. The result is that N5 and P5 are nonconducting while P4 and N4 are both conducting and pass signals from the latch 308 to the logic gate 310.

Figure 4:
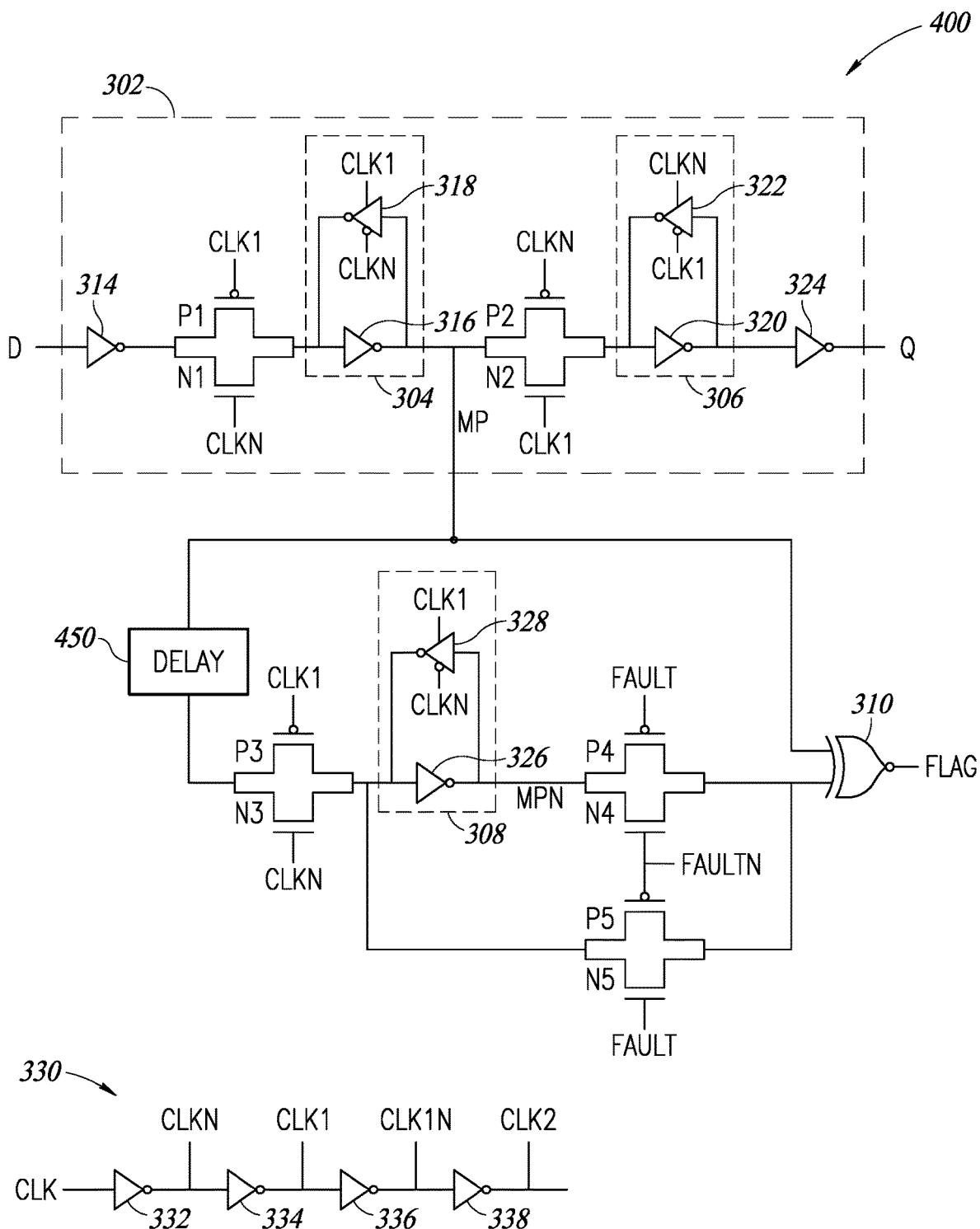
FIG. 4 is a schematic diagram of an integrated circuit, according to one embodiment.

FIG. 4 is a schematic diagram of an integrated circuit 400, according to one embodiment. The integrated circuit 400 is substantially identical to the integrated circuit 300 of FIG. 3, except that the integrated circuit 400 includes a delay element 450 and the flip-flop 302 receives the same clock signals as the latch 308. The delay element 450 is coupled between the output of the first latch 304 and the input of the third latch 308.

The delay element 450 delays a signal propagating from the output of the first inverter 304 to the input of the third inverter 308. This delay results in the third latch 308 failing to capture data before the second latch 306 will fail to capture data. The data arrives later at the input of the third latch 308 than at the input of the second latch 306. If the second latch 306 is close to failing to capture the data before the next rising edge of the clock signal, then the third latch 308 will fail to capture the data before the next rising edge of the clock signal. The logic gate 310 detects the failure of the third latch 308 to capture the data when the second latch succeeded in capturing the data. The logic gate 310 can then cause FLAG to go high.

The delay element 450 includes one or more buffers. The buffers introduce a delay in the signal propagation between the output of the first latch 304 and the input of the third latch 308.

Figure 5:
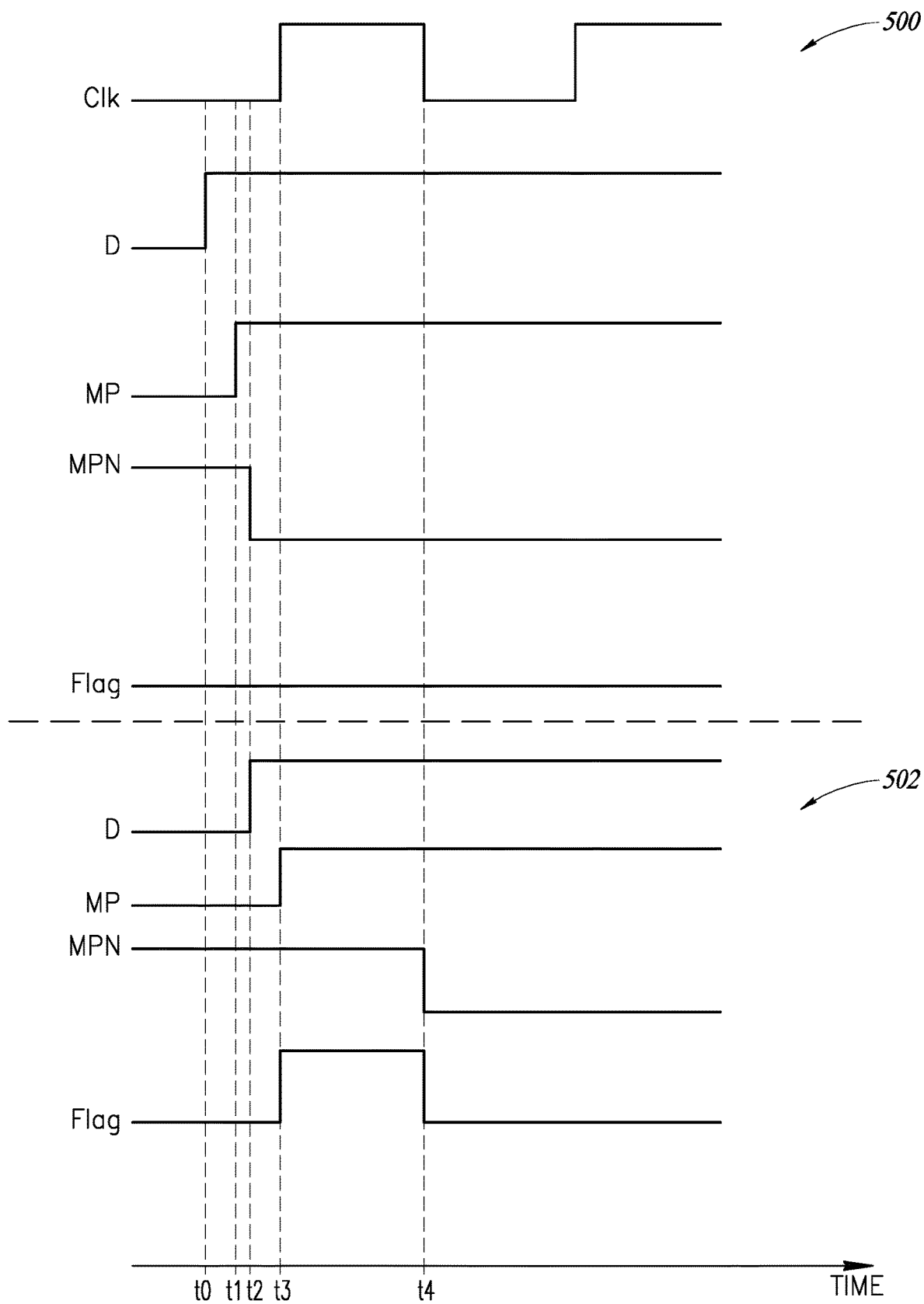
FIG. 5 is a timing diagram of signals within the integrated circuit of FIG. 4, according to one embodiment.

FIG. 5 includes timing diagrams 500, 502 associated with monitoring timing signal compliance related to a flip-flop, according to one embodiment. The timing diagrams represent timing signals associated with the integrated circuit 300 of FIG. 3. The timing diagram 500 illustrates an example in which the third latch 308 captures data within the same clock cycle as the flip-flop 302. The timing diagram 502 illustrates an example in which the third latch 308 does not capture data within the same clock cycle as the flip-flop 302.

With reference to the timing diagram 500, at time t0 data is received at the data input D of the flip-flop 302. This is represented by D going high. At time t1, the midpoint node MP receives the data from the data input D via the inverter 314 and the latch 304. The data signal is passed from the midpoint node MP into the third latch 308. The third latch 308 inverts the data such that at t2, MPN goes low. At time t3, the clock signal CLK goes high. When the clock signal is high between times t3 and t4, the output of the logic gate 310 is monitored. In the example of FIG. 500, MP is high and MPN is low while the clock signal is high between times t3 and t4. The output of logic gate 310 is low between t3 and t4. Accordingly, Flag is low between t3 and t4. This means that the flip-flop 302 is not approaching timing failure.

With reference to the timing diagram 502, a data signal arrives at the data input D at time t2, significantly closer to the rising edge of the clock signal than in the example of the timing diagram 500. In this case, the midpoint node MP goes high at time t3 when the clock signal goes high. The data signal is passed to the third flip-flop 308 from the midpoint MP. However, because the data was not received while the clock signal is low, the third latch 308 does not invert the data signal and pass the inverted data signal to the logic gate 310 before the clock signal goes high at time t3. The result is that MPN remains high until time t4 when the clock signal goes low. Accordingly, between times t3 and t4, both MP and MPN are high. The result is that Flag goes high between times t3 and t4. This indicates that the flip-flop 302 is approaching a timing failure. From here, steps can be taken to correct or otherwise address timing signals associated with the flip-flop 302 so that a timing failure does not occur.

Figure 6:
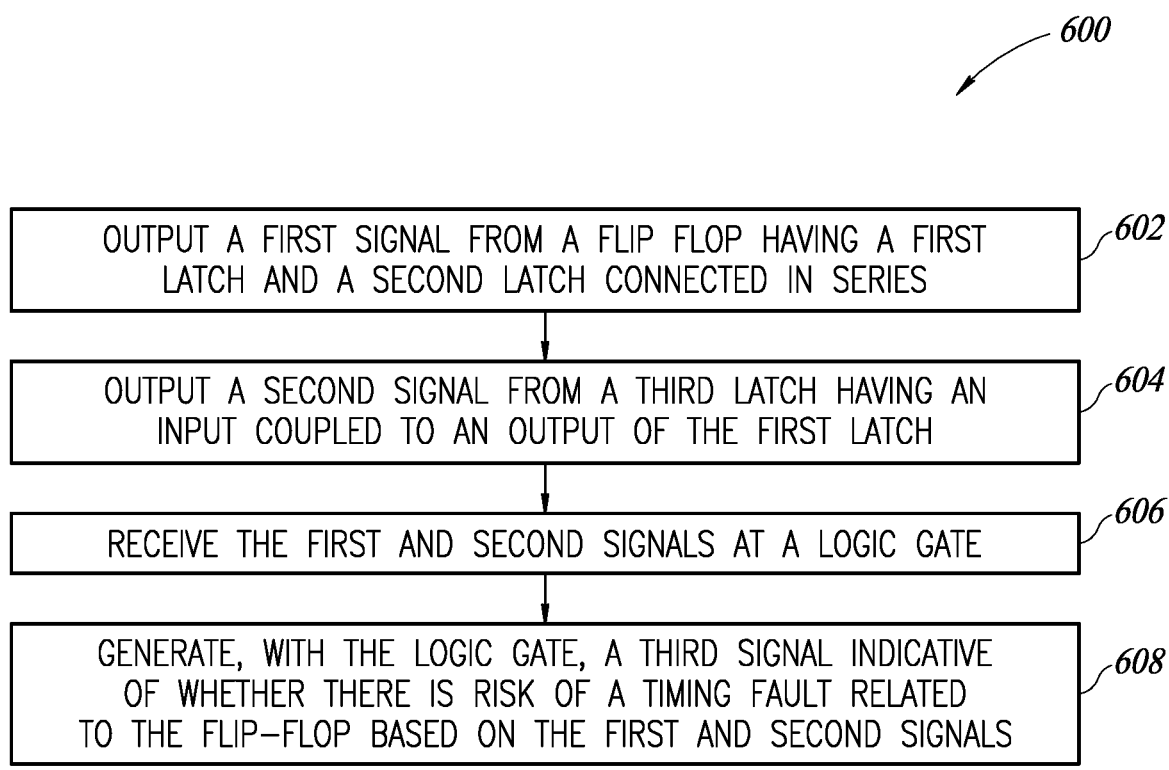
FIG. 6 is a flow diagram of a method for operating an integrated circuit, according to one embodiment.

FIG. 6 is a flowchart of a method for detecting timing signal failures. At 602, the method 600 includes outputting a first signal from a flip-flop having a first latch and a second latch connected in series, according to one embodiment. At 604, the method 600 includes outputting a second signal from the third latch having an input coupled to an output of the first latch, according to one embodiment. At 606, the method 600 includes receiving the first and second signals at a logic gate, according to one embodiment. At 608, the method 600 includes generating, with the logic gate, a third signal indicative of whether there is a risk of a timing fault related to the first flip-flop based on the first and second signals.

In one embodiment, an integrated circuit includes a flip-flop. The flip-flop includes a first latch having an input and an output. The flip-flop includes a second latch having an input coupled to the output of the first latch and an output corresponding to the output of the flip-flop. The integrated circuit includes a third latch having an input coupled to the output of the first latch a fault detector coupled to the flip-flop and the third latch and configured to receive a first signal from the third latch and a second signal from the flip-flop and to output a third signal indicating whether or not the flip-flop is at risk for a timing failure based on the first and second signals.

In one embodiment, a method incudes outputting a first signal from a flip-flop having a first latch and a second latch connected in series. The method includes outputting a second signal from a third latch having an input coupled to an output of the first latch. The method includes receiving the first and second signals at a fault detector and generating, with the fault detector, a third signal indicative of whether there is risk of a timing fault related to the flip-flop based on the first and second signals.

In one embodiment, an integrated circuit includes a flip-flop. The flip-flop includes a first latch and a second latch coupled to the first latch at a midpoint node of the flip-flop. The integrated circuit includes a third latch coupled to the midpoint node of the flip-flop and including an output. The integrated circuit includes a logic gate having a first input coupled to the midpoint node of the flip-flop, a second input coupled to the output of the third latch, and an output configured to output a signal indicating risk of a timing failure in the flip-flop.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
    a flip-flop including:
        a first latch having:
            an input; and
            an output;
        a second latch having:
            an input coupled to the output of the first latch; and
            an output; and
        a third latch having an input coupled to the output of the first latch; and
    a logic gate coupled to the flip-flop and the third latch and configured to receive a first signal from the flip-flop and a second signal from the third latch and to output a third signal indicating whether or not the flip-flop is at risk of a timing failure based on the first and second signals.

2. The integrated circuit of claim 1 wherein the logic gate includes a first input coupled to the output of the first latch and configured to receive the first signal from the output of the first latch.

3. The integrated circuit of claim 2 wherein the logic gate includes a second input coupled to an output of the third latch and configured to receive the second signal from the output of the third latch.

4. The integrated circuit of claim 3, further comprising a delay element coupled between the output of the first latch and the input of the third latch.

5. The integrated circuit of claim 4 wherein the delay element is configured to introduce a signal delay between the output of the first latch and the input of the first latch, wherein the signal delay is selected to ensure that the logic gate will detect a timing failure in the third latch before a timing failure occurs in the flip-flop.

6. The integrated circuit of claim 3 wherein the flip-flop receives a first clock signal, wherein the third latch receives a second clock signal offset from the first clock signal.

7. The integrated circuit of claim 6 wherein the offset is selected to ensure that a fault detector will detect a timing failure in the third latch before a timing failure occurs in the flip-flop.

8. The integrated circuit of claim 7 wherein the first clock signal is delayed relative to the second clock signal.

9. The integrated circuit of claim 1 wherein the logic gate is an exclusive OR gate.

10. The integrated circuit of claim 1, further comprising a fault response circuit coupled to the output of the logic gate and configured to adjust timing of the flip-flop responsive to logic gate indicating risk of a timing failure.

11. A method, comprising:
    outputting a first signal from a flip-flop having a first latch and a second latch connected in series;
    outputting a second signal from a third latch having an input coupled to an output of the first latch;
    receiving the first and second signals at a logic gate; and
    generating, with the logic gate, a third signal indicative of whether there is risk of a timing fault related to the flip-flop based on the first and second signals.

12. The method of claim 11, further comprising delaying signal propagation between the output of the first latch and the input of the third latch with a delay element.

13. The method of claim 12 wherein the delay element includes one or more buffers.

14. The method of claim 11, further comprising:
    operating the flip-flop with a first clock signal; and
    operating the third latch with a second clock signal, the first clock signal being delayed relative to the second clock signal.

15. The method of claim 11, further comprising outputting the first signal to the logic gate from the output of the first latch.

16. The method of claim 11, further comprising outputting the first signal to the logic gate from an output of the second latch.

17. The method of claim 16, further comprising adjusting timing of the flip-flop responsive to the third signal indicating a risk of a timing fault.

18. An integrated circuit, comprising:
    a flip-flop including:
        a first latch;
        a midpoint node;
        a second latch coupled to the first latch at the midpoint node; and
        a third latch coupled to the midpoint node of the flip-flop and including an output; and
        a logic gate including;
            a first input coupled to the midpoint node of the flip-flop;
            a second input coupled to the output of the third latch; and
            an output configured to output a signal indicating risk of a timing failure in the flip-flop.

19. The integrated circuit of claim 18, further comprising a signal delay element coupled between the midpoint node and the third latch.

20. The integrated circuit of claim 18 wherein the signal indicates whether the third latch processed data from the midpoint node within a selected timing window.

* * * * *